(12) United States Patent
Kavalipurapu et al.

(10) Patent No.: US 9,633,744 B2
(45) Date of Patent: Apr. 25, 2017

(54) ON DEMAND KNOCKOUT OF COARSE SENSING BASED ON DYNAMIC SOURCE BOUNCE DETECTION

(71) Applicant: Intel Corporation, Santa Clara, CA (US)

(72) Inventors: Kalyan C. Kavalipurapu, Santa Clara, CA (US); Jae-Kwan Park, Cupertino, CA (US); Erwin E. Yu, San Jose, CA (US); Michele Piccardi, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/858,771

(22) Filed: Sep. 18, 2015

(65) Prior Publication Data

US 2017/0084347 A1 Mar. 23, 2017

(51) Int. Cl.
 *G11C 16/04* (2006.01)
 *G11C 16/34* (2006.01)
 *G11C 16/26* (2006.01)

(52) U.S. Cl.
 CPC ...... *G11C 16/3459* (2013.01); *G11C 16/3454* (2013.01); *G11C 16/0483* (2013.01); *G11C 16/26* (2013.01)

(58) Field of Classification Search
 CPC . G11C 16/0483; G11C 16/26; G11C 16/3454; G11C 16/3459; G11C 11/5642; G11C 16/3418; G11C 7/02; G11C 11/4085; G11C 7/08; G11C 7/1051; G11C 7/1057; G11C 7/1078; G11C 16/0433; G11C 8/08
 See application file for complete search history.

(56) References Cited

U.S. PATENT DOCUMENTS

| | | | |
|---|---|---|---|
| 7,057,934 B2 | 6/2006 | Krishnamachari et al. | |
| 7,139,198 B2 | 11/2006 | Guterman et al. | |
| 7,986,559 B2 | 7/2011 | Lee et al. | |
| 8,339,852 B2 | 12/2012 | Lim | |
| 8,675,416 B2 | 3/2014 | Lee | |
| 2009/0003077 A1* | 1/2009 | Lim | G11C 16/3454 365/185.21 |
| 2010/0188903 A1* | 7/2010 | Lee | G11C 16/3459 365/185.22 |

(Continued)

OTHER PUBLICATIONS

International Search Report and Written Opinion for International Patent Application No. PCT/US20161046173, mailed Nov. 14, 2016, 11 pages.

*Primary Examiner* — Son Dinh
*Assistant Examiner* — Uyen B Tran
(74) *Attorney, Agent, or Firm* — Jordan IP Law, LLC (57) ABSTRACT

Systems, apparatuses and methods may provide for determining a magnitude of a bounce voltage on a source line associated with one or more memory cells and conducting, if the magnitude of the bounce voltage exceeds a threshold, a coarse-level program verification and a fine-level program verification of the one or more memory cells. Additionally, if the magnitude of the bounce voltage does not exceed the threshold, only the fine-level program verification of the one or more memory cells may be conducted. In one example, the coarse-level program verification is bypassed if the magnitude of the bounce voltage does not exceed the threshold.

29 Claims, 6 Drawing Sheets

(56) References Cited

U.S. PATENT DOCUMENTS

| | | | |
|---|---|---|---|
| 2011/0292724 A1* | 12/2011 | Kim | G11C 16/0483 |
| | | | 365/185.03 |
| 2012/0087192 A1* | 4/2012 | Fang | G11C 16/10 |
| | | | 365/185.19 |
| 2013/0107623 A1 | 5/2013 | Kavalipurapu et al. | |
| 2013/0121083 A1* | 5/2013 | Choi | G11C 16/3459 |
| | | | 365/185.22 |
| 2014/0063947 A1 | 3/2014 | Ghodsi | |

* cited by examiner

ON DEMAND KNOCKOUT OF COARSE SENSING BASED ON DYNAMIC SOURCE BOUNCE DETECTION

TECHNICAL FIELD

Embodiments generally relate to programming memory structures.

BACKGROUND

Programming conventional NAND flash memory may involve applying a sequence of program pulses to the cells of the flash memory, with each program pulse being followed by coarse-level program verification and optional fine-level program verification for the memory cells that are not verified during the coarse-level program verification. Such an approach may increase programming time and have a negative impact on performance.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
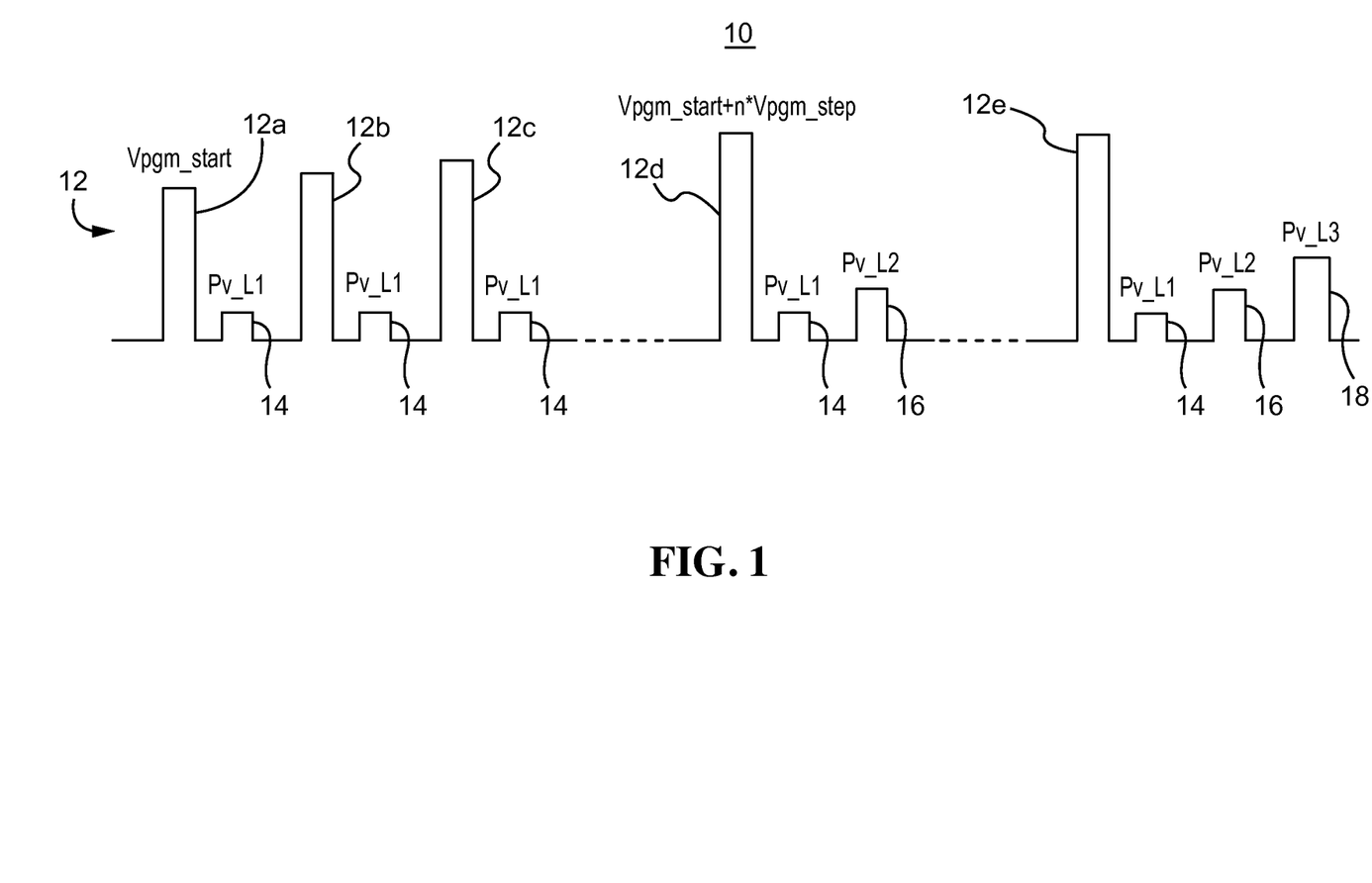
FIG. 1 is a plot of an example of a program waveform according to an embodiment.

Turning now to FIG. 1, a program waveform 10 is shown for a memory structure. The program waveform 10 can be used for a NAND flash memory, three-dimensional (3D) NAND memory array devices, or other memory devices. In the illustrated example, a sequence of program pulses 12 (12a-12e) are generated (e.g., beginning at voltage Vpgm_start) for different programming levels (e.g., n levels), with successive instances of the pulses 12 being incremented by a step value (e.g., n*Vpgm_step). Thus, a leftmost program pulse 12a may represent an initial pulse for level one, a middle program pulse 12d may represent an initial pulse for level two, a rightmost program pulse 12e may represent an initial pulse for level three, and so forth. Programming verification operations may generally be conducted after each program pulse 12, wherein the programming verification operations determine whether the program pulse 12 has successfully set the memory cell voltage for the programming level(s) involved. Thus, first verification pulses 14 (e.g., Pv_L1) may be generated after level one program pulses 12, second verification pulses 16 (e.g., Pv_L2) may be generated after level two program pulses 12, third verification pulses 18 (e.g., Pv_L3) may be generated after level three program pulses, and so forth, wherein the verification pulses 14, 16, 18 may be applied to the memory cells in question.

The programming verifications may include coarse-level and/or fine-level program verifications. As will be discussed in greater detail, information regarding the difference from the target voltage to the source voltage (e.g., voltage "source bounce" due to bus current multiplied by bus resistance) may be used to selectively bypass the coarse-level program verification. Such an approach may decrease programming time and enhance performance.

Figure 2A:
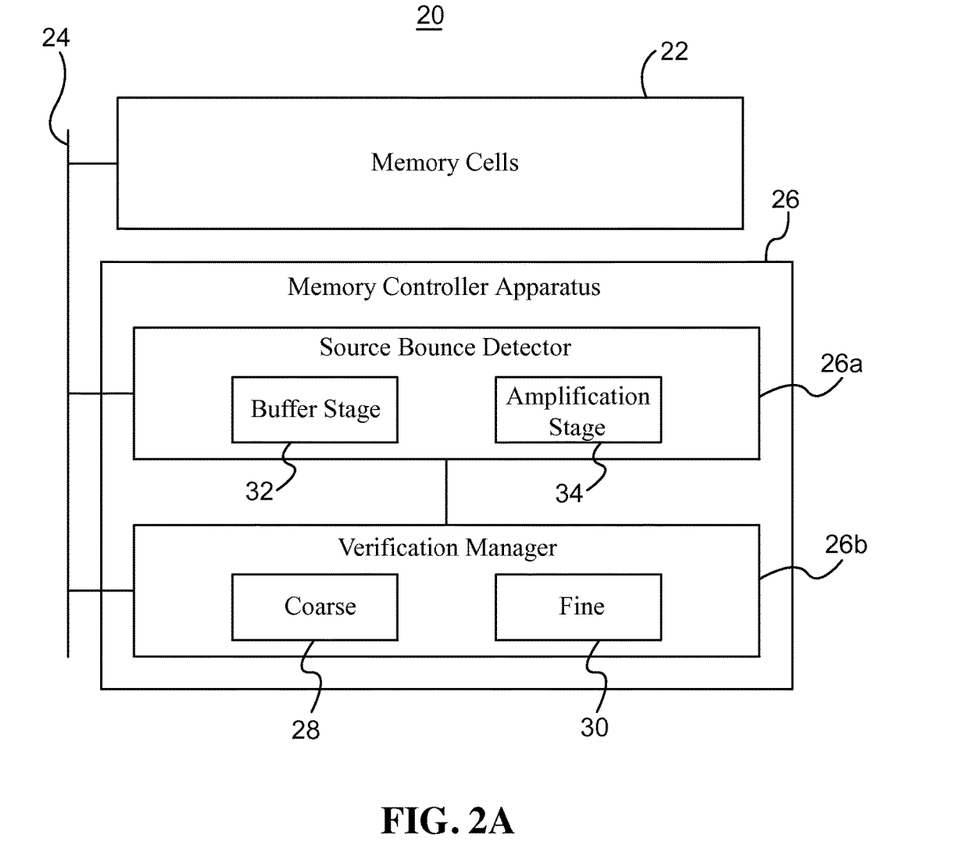
FIG. 2A is a block diagram of an example of a memory subsystem according to an embodiment.
Figure 2B:
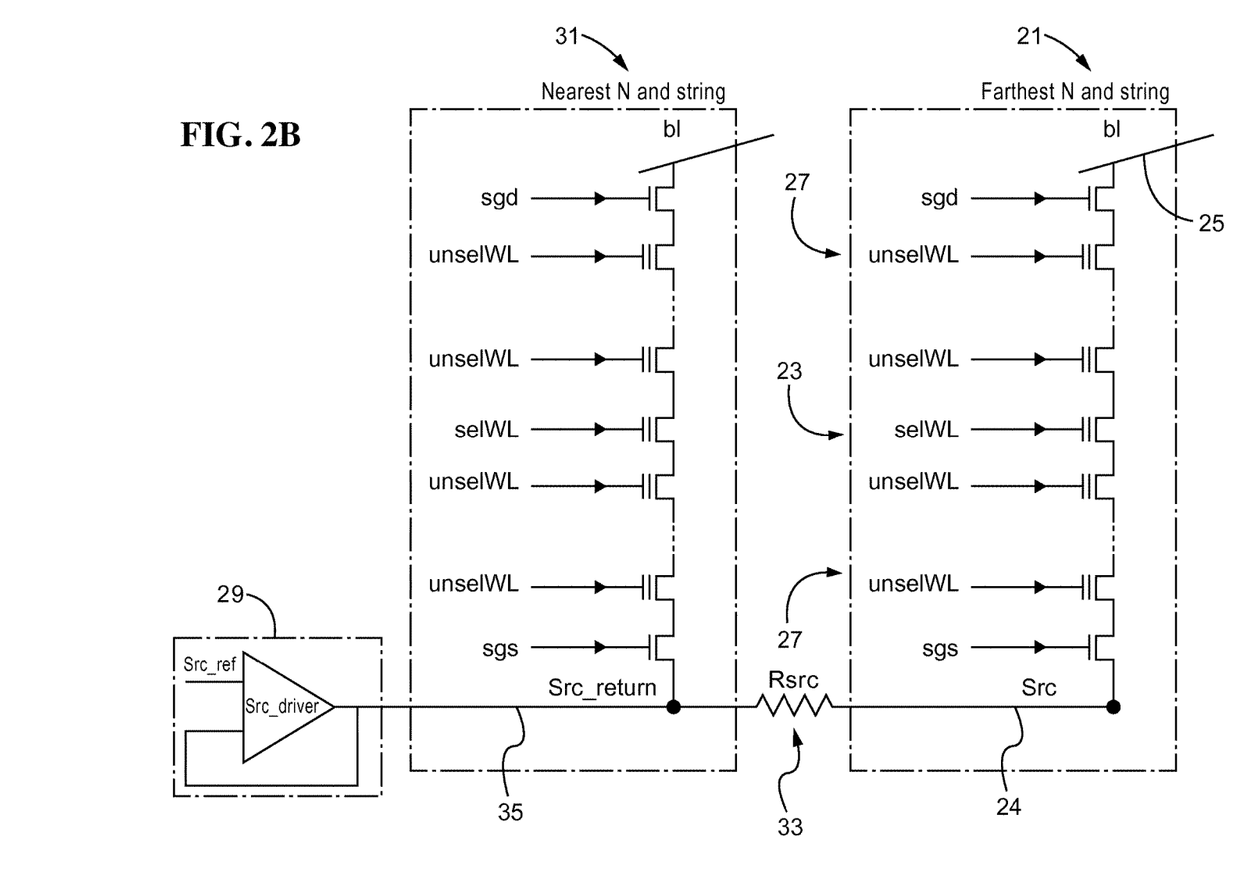
FIG. 2B is a schematic diagram of an example of a plurality of NAND strings according to an embodiment.

FIG. 2A shows a memory subsystem 20 that includes a plurality of memory cells 22 coupled to a source line 24 of a memory bus. FIG. 2B shows a first NAND string 31 of transistors and a second NAND string 21 of transistors, wherein the NAND strings 21, 31 (e.g., nodes, cells) may be included in the plurality of memory cells 22 (FIG. 2A). In general, the first NAND string 31 is relatively close to a source driver 29 and the second NAND string 21 is relatively far away from the source driver 29. The illustrated second NAND string 21 includes a selected word line 23 (selWL) and one or more unselected word lines (unselWL). The second NAND string 21 may also include a bit line 25 (bl) connection on a drain side of the second NAND string 21 and the source line 24 (src) connection on a source side of the second NAND string 21. In addition, a select gate drain-side (sgd) device may couple the second NAND string 21 to the bit line 25 connection and a select gate source-side (sgs) may couple the second NAND string 21 to the source line 24 connection. The illustrated first NAND string 31 is the nearest node to the source driver 29 and may be coupled to the source driver 29 via a source return line 35 (src_return) connection. The source line 24 and the source return line 35 may be part of a source mesh having a resistance 33 that increases as the distance from the source driver 29 increases.

Referring again to FIG. 2A, a memory controller apparatus 26 (26a, 26b) may also be coupled to the source line 24 of the memory bus, wherein a source bounce detector 26a may determine a magnitude of a bounce voltage on the source line 24. In this regard, a program verify operation may include sensing a voltage and/or current change of a bit line coupled to a target/selected cell in the plurality of memory cells 22 in order to determine the data state of the target cell. The sensing operation may involve applying a signal to (e.g., driving or biasing) a bit line associated with a target memory cell above a signal (e.g., bias voltage) applied to a source line associated with the target memory cell. The sensing operation may therefore include pre-charging the bit line followed by discharge when the target cell begins to conduct, and sensing the discharge. Thus, the source bounce may be considered the difference from the target voltage to the source voltage, wherein the difference is due to bus current multiplied by bus resistance. In one example, the source bounce detector 26a samples a return voltage and a source voltage on the source line 24 in order to determine the source bounce.

The source bounce detector 26a may include a buffer stage 32 and an amplification stage 34 coupled to the buffer stage 32. Moreover, the source bounce detector 26a may sample the source voltage from a selected node in the plurality of memory cells 22, wherein the distance between the selected node and a driver such as the source driver 29 (FIG. 2B) coupled to the source line 24 is greater than a distance between one or more other nodes in the plurality of memory cells 22 and the driver. The selected node may therefore be considered a "worst case" node due to a relatively high source mesh resistance that may result in a highest expected bounce voltage magnitude at the selected node. For example, the selected node might be the farthest NAND string such as, for example, the second NAND string 21 (FIG. 2B) in the plurality of memory cells 22, relative to the source driver. In another example, the selected node in a 3D NAND architecture might be the farthest in a tile column when the source driver is referring to a local source return that is relatively close to the driver.

The source bounce determined by the source bounce detector 26a may be used by a verification manager 26b to determine whether the one or more memory cells were programmed successfully. More particularly, the illustrated verification manager 26b includes a coarse component 28 and a fine component 30. If the magnitude of the bounce voltage exceeds a threshold such as, for example, a maximum system-tolerable technology-determined threshold, the verification manager 26b may use the coarse component 28 to conduct a coarse-level program verification of the one or more memory cells and use the fine component 30 to conduct a fine-level program verification of the one or more memory cells. If, on the other hand, the magnitude of the bounce threshold equals or falls below the threshold, the verification manager 26b may only use the fine component 30 to conduct the fine-level program verification of the one or more memory cells. In this regard, a relatively low source bounce may indicate that the coarse-level program verification may be bypassed without concern over the ability of the fine component 30 to tolerate the source bounce.

Although depicted as part of a memory controller apparatus, either or both of the source bounce detector 26a and verification manager 26b may be implemented within a memory device.

Figure 3:
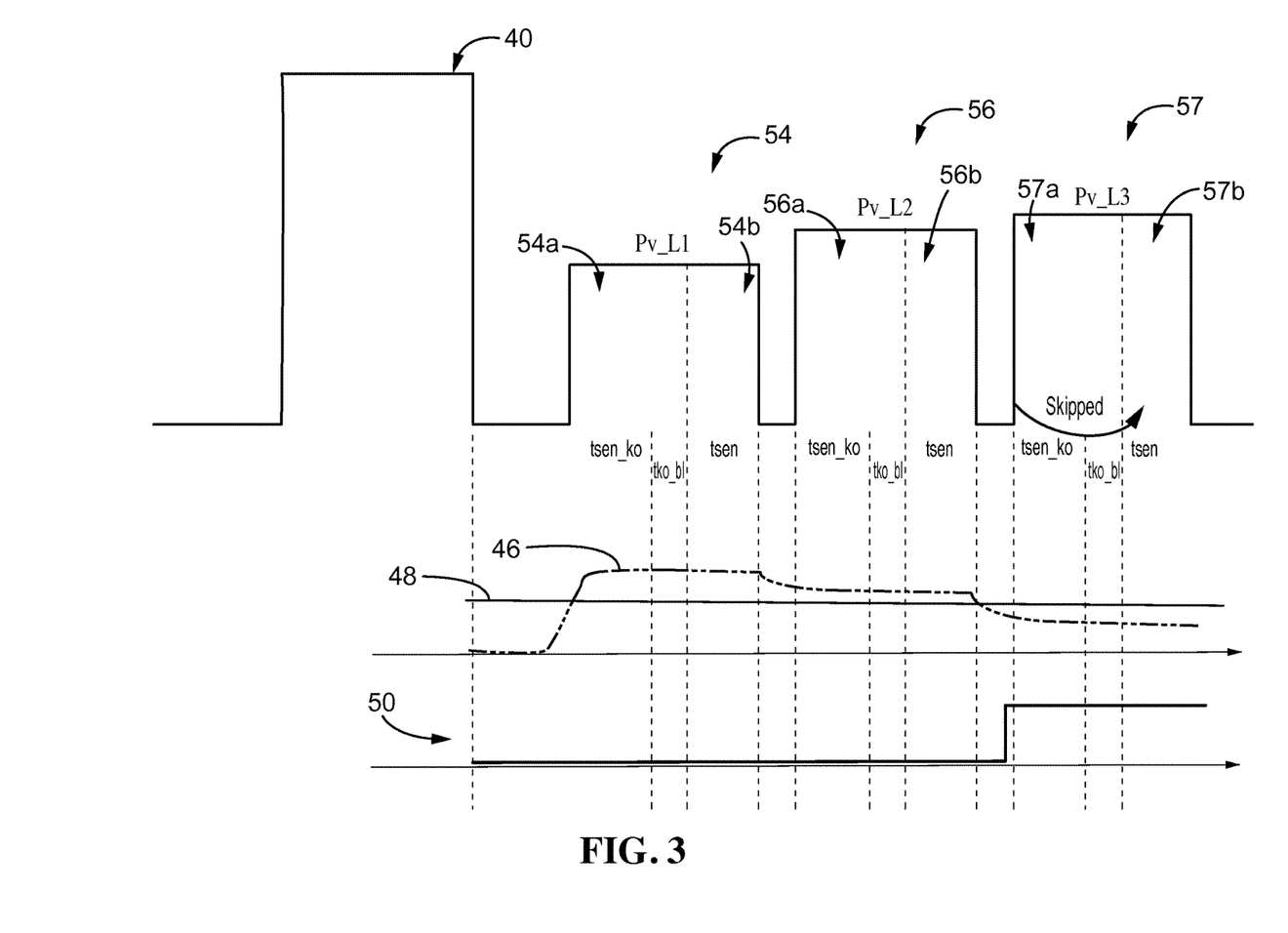
FIG. 3 is a plot of an example of a set of program waveforms for a particular program pulse according to an embodiment.

Turning now to FIG. 3, a set of program waveforms are shown for a particular program pulse. In the illustrated example, a program pulse 40 is used to program one or more memory cells such as, for example, the memory cells 22 (FIG. 2A). The illustrated timings may be described as follows—tsen_ko: sense time for coarse sensing; tsen: sense time for fine sensing; and tko_bl: bit line cleanup time after sensing.

The program pulse 40 may generally correspond to the rightmost program pulse 12e (FIG. 1), already discussed, that initiates the level three programming sequence. Additionally, a first region 54 (54a, 54b) may correspond to the first verification pulse 14 (FIG. 1) following the level three program pulse, wherein the first region 54 includes a coarse-level region 54a and a fine-level region 54b. Similarly, a second region 56 (56a, 56b) may correspond to the second verification pulse 16 (FIG. 1) following the level three program pulse, wherein the second region 56 includes a coarse-level region 56a and a fine level region 56b. A third region 57 (57a, 57b) may correspond to the third verification pulse 18 (FIG. 1) following the level three program pulse, wherein the third region 57 includes a coarse-level region 57a and a fine-level region 57b.

Of particular note is that the coarse-level region 57a may be selectively skipped based on whether a magnitude of a bounce voltage 46 exceeds a threshold 48. As already noted, the bounce voltage 46 may be sampled from a selected node that represents a worst case node. For example, a skip knockout signal 50 may be asserted in response to the magnitude of the bounce voltage 46 equaling or falling below the threshold 48 in the coarse-level region 57a. A delay between assertion of the skip knockout signal 50 and the magnitude of the bounce voltage equaling or falling below the threshold 48 may be due to propagation delay and/or decision timing of the system. In this regard, the assertion of the skip knockout signal 50 may be made by its value transitioning to either logical high or logical low. As a result, the time associated with the coarse-level program verification (e.g., tsen_ko and tko_bl) may be skipped/avoided and fine-level program verification can be used instead for program verify. Accordingly, the illustrated approach may substantially enhance performance by reducing programming verification time via on demand knockout of coarse sensing.

Figure 4:
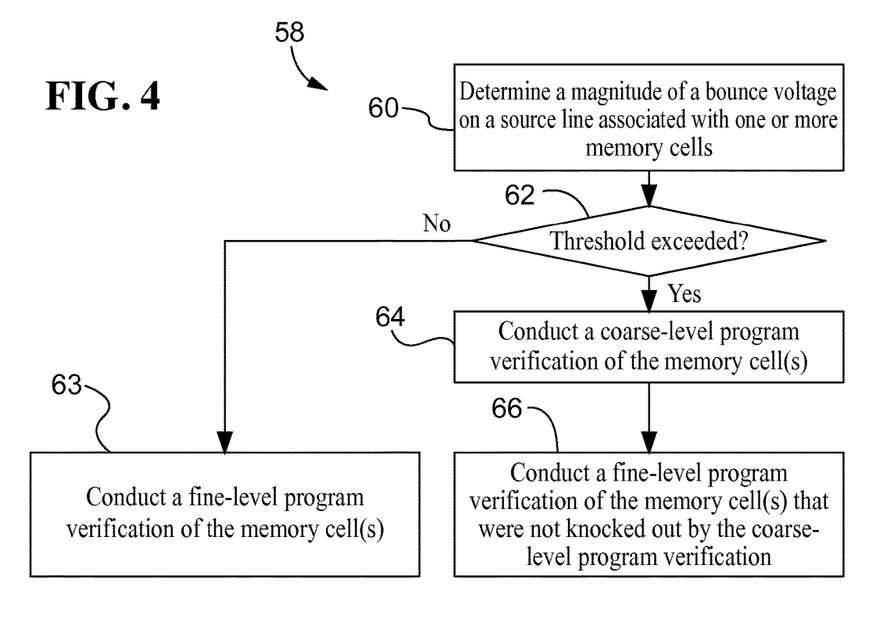
FIG. 4 is a flowchart of an example of a method of verifying memory programming according to an embodiment.

FIG. 4 shows a method 58 of verifying memory programming. The method 58 may generally be implemented in a memory controller apparatus such as, for example, the memory controller apparatus 26 (FIG. 2), already discussed. More particularly, the method 58 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

Illustrated processing block 60 provides for determining a magnitude of a bounce voltage on a source line associated with one or more memory cells, wherein a determination may be made at block 62 as to whether the magnitude of the bounce voltage exceeds a threshold. If not, illustrated block 63 conducts only a fine-level program verification of the one or more memory cells. Otherwise, a coarse-level program verification of the one or more memory cells may be conducted at block 64 and illustrated block 66 conducts a fine-level program verification of the memory cell(s) that were not knocked out by the coarse-level program verification.

Figure 5:
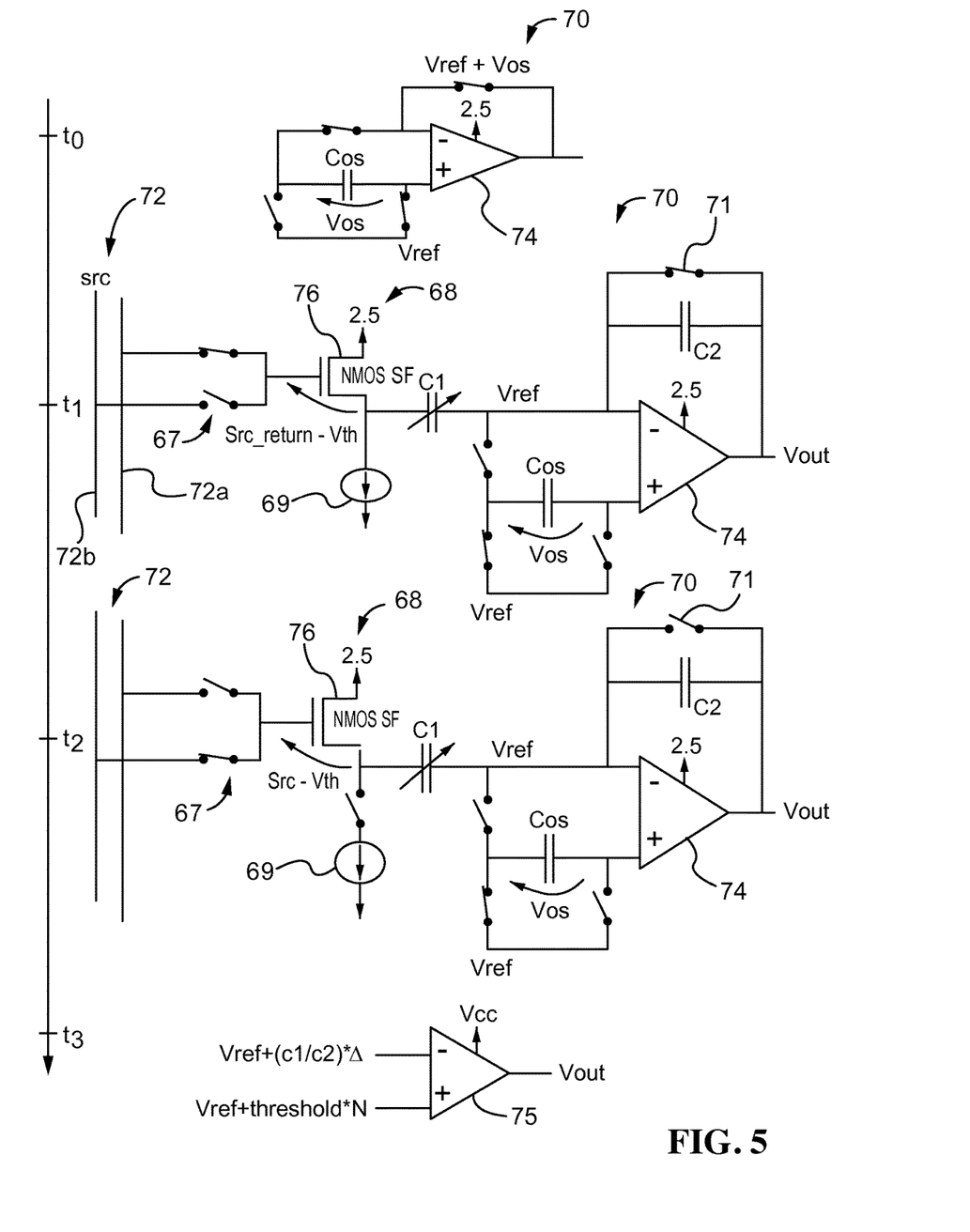
FIG. 5 is a set of schematic drawings of an example of a source bounce detector according to an embodiment.

FIG. 5 shows one approach to implementing a source bounce detector such as, for example, the source bounce detector 26a (FIG. 2). In the illustrated example, a buffer stage 68 having a source follower (SF) transistor 76 (e.g., NMOS/N-type Metal Oxide Semiconductor) and a current source 69 is coupled, via switches 67, to a source line 72 (72a, 72b) and an amplification stage 70 is coupled to the buffer stage 68. The amplification stage 70 may include an operational amplifier 74 that is optionally auto-zeroed at time to (e.g., during an auto-zero phase). Auto-zeroing may be considered the removal of any voltage offset associated with the operational amplifier 74. At time $t_1$ (e.g., during a first active phase), a return portion 72a of the source line 72 may be sampled via the buffer stage 68 in order to determine a return voltage (e.g., src_return). The return voltage may be applied to the gate of the SF transistor 76, wherein an initial charge as indicated in Expression (1) below may be stored onto a first capacitor C1.

$$Q1\_i = C1(src\_return - Vth - Vref) \quad (1)$$

Where Vth is the threshold voltage of the SF transistor and Vref is a general reference voltage that is common to the operational amplifier 74 and a comparator 75 (discussed in greater detail below). At time $t_2$ (e.g., during a second active phase), a source portion 72b of the source line 72 may be sampled via the buffer stage 68 in order to determine a source voltage (e.g., src). The source voltage may be applied to the gate of the source follower transistor 76, wherein a new final charge as indicated in Expression (2) below may be stored onto the capacitor C1.

$$Q1\_f = C1(src - Vth - Vref) \quad (2)$$

Thus, the difference in charge may be given by.

$$\Delta Q = Q1\_f - Q1\_i = C1(src - src\_return) \quad (3)$$

Accordingly, the voltage threshold is a common mode that disappears from the expression. Additionally, any threshold mismatch at the SF transistor 76 may be disregarded. The amplification stage 70 may also include a second capacitor C2 and a switch 71, wherein, $$\Delta Q = Q2 = C2(Vout - Vref) \quad (4)$$

Where the switch 71 is closed at time $t_1$, the switch 71 is open at time $t_2$ and Vout is the output voltage. The node common to C1 and C2 may be an isolated node, wherein any charge moving away from C1 may necessarily be stored on C2. Accordingly, $$C1(src - src\_return) = C2(Vout - Vref) \quad (5)$$

$$Vout = C1/C2(src - src\_return) + Vref \quad (6)$$

At time $t_3$ (e.g., a final comparison phase), a comparator 75 may compare Vref+threshold*N to Vref+(C1/C2)*Δ, where N=C1/C2 (e.g., gain factor) and Δ is the source bounce. If Vout=Vcc coarse-level program verification may be bypassed.

Figure 6:
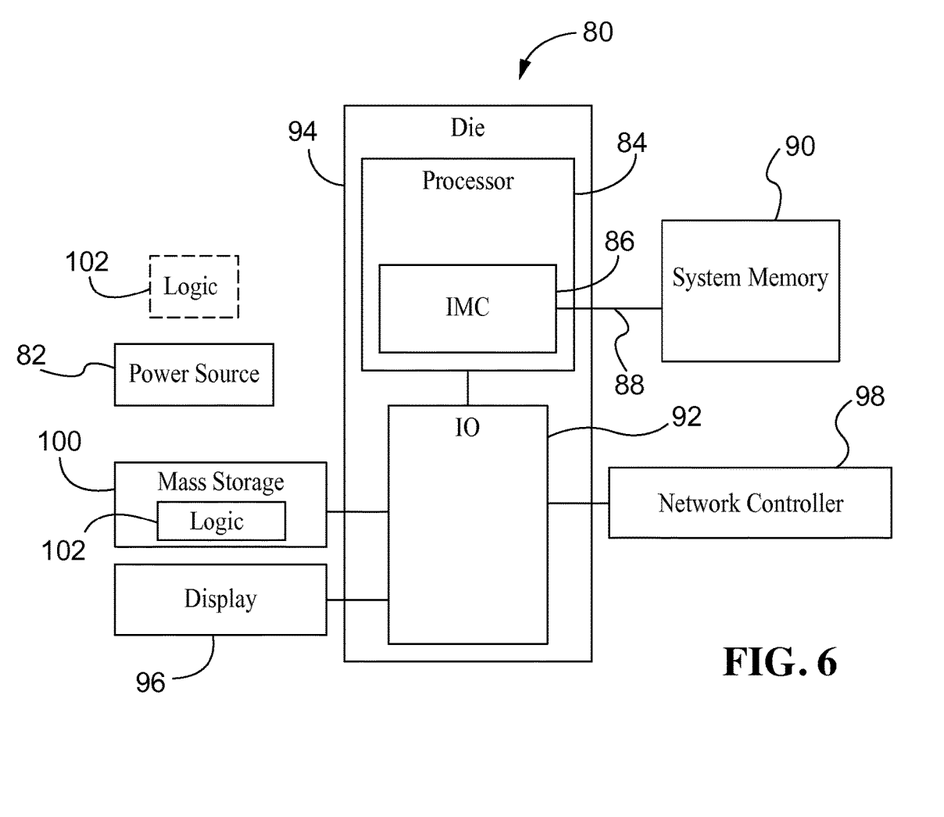
FIG. 6 is a block diagram of an example of a performance-enhanced computing system according to an embodiment.

FIG. 6 shows a performance-enhanced computing system 80. The computing system 80 may generally be part of an electronic device/platform having computing functionality (e.g., personal digital assistant/PDA, notebook computer, tablet computer, server), communications functionality (e.g., smart phone), imaging functionality, media playing functionality (e.g., smart television/TV), wearable functionality (e.g., watch, eyewear, headwear, footwear, jewelry), vehicular functionality (e.g., car, truck, motorcycle, etc., or any combination thereof. In the illustrated example, the system 80 includes a power source 82 to supply power to the system 80 and a processor 84 having an integrated memory controller (IMC) 86, which may use a bus 88 to communicate with a system memory 90. The system memory 90 may include, for example, volatile dynamic RAM (DRAM) configured as one or more memory modules such as, for example, dual inline memory modules (DIMMs), small outline DIMMs (SODIMMs), etc.

The illustrated system 80 also includes an input output (IO) module 92 implemented together with the processor 84 on a semiconductor die 94 as a system on chip (SoC), wherein the JO module 92 functions as a host device and may communicate with, for example, a display 96 (e.g., touch screen, liquid crystal display/LCD, light emitting diode/LED display), a network controller 98, and mass storage 100 (e.g., hard disk drive/HDD, optical disk, flash memory, etc.). The mass storage 100 may include logic 102 that determines a magnitude of a bounce voltage on a source line associated with one or more memory cells in the mass storage 100. The logic 102 may also conduct a coarse-level program verification and a fine-level program verification of the one or more memory cells if the magnitude of the bounce voltage exceeds a threshold. If, on the other hand, the magnitude of the bounce voltage equals or falls below the threshold, the logic 102 may conduct only the fine-level program verification of the one or more memory cells. Thus, the logic 102 may implement one or more aspects of the method 58 (FIG. 4), already discussed. The logic 102, which may be implemented in logic instructions, configurable logic and/or fixed-functionality logic hardware, may optionally be implemented elsewhere in the system 80 such as, for example, in the IMC 86, IO module 92, and so forth.

Additional Notes and Examples

Example 1 may include a performance-enhanced computing system comprising a system on chip (SoC), a bus coupled to the SoC, the bus including a source line, and a memory subsystem coupled to the bus, the memory subsystem including a plurality of memory cells associated with the source line and a controller apparatus comprising, a source bounce detector to determine a magnitude of a bounce voltage on the source line, and a verification manager to conduct a coarse-level program verification and a fine-level program verification of one or more of the plurality of memory cells if the magnitude of the bounce voltage exceeds a threshold, and conduct the fine-level program verification of the one or more memory cells if the magnitude of the bounce voltage equals or falls below the threshold, wherein the coarse-level program verification is to be bypassed if the magnitude of the bounce voltage equals or falls below the threshold.

Example 2 may include the system of Example 1, wherein the source bounce detector is to sample a return voltage on the source line and sample a source voltage on the source line.

Example 3 may include the system of Example 2, wherein the source bounce detector includes a buffer stage, and an amplification stage coupled to the buffer stage, the amplification stage comprising an operational amplifier, wherein the return voltage and the source voltage are to be sampled via the buffer stage.

Example 4 may include the system of Example 3, wherein the verification manager is to auto-zero the operational amplifier prior to determining whether the magnitude of the bounce voltage exceeds the threshold.

Example 5 may include the system of any one of Examples 2 to 4, wherein the source bounce detector is to sample the source voltage from a selected node.

Example 6 may include the system of Example 5, wherein a distance between the selected node and a driver coupled to the source line is greater than a distance between one or more other nodes and the driver.

Example 7 may include the system of claim 1, further comprising at least one processor communicatively coupled to the memory subsystem and a network interface communicatively coupled to the at least one processor.

Example 8 may include a memory controller apparatus comprising a source bounce detector to determine a magnitude of a bounce voltage on a source line associated with one or more memory cells, and a verification manager to conduct a coarse-level program verification and a fine-level program verification of the one or more memory cells if the magnitude of the bounce voltage exceeds a threshold, and conduct the fine-level program verification of the one or more memory cells if the magnitude of the bounce voltage equals or falls below the threshold, wherein the coarse-level program verification is to be bypassed if the magnitude of the bounce voltage equals or falls below the threshold.

Example 9 may include the apparatus of Example 8, wherein the source bounce detector is to sample a return voltage on the source line and sample a source voltage on the source line.

Example 10 may include the apparatus of Example 9, wherein the source bounce detector includes a buffer stage, and an amplification stage coupled to the buffer stage, the amplification stage comprising an operational amplifier, wherein the return voltage and the source voltage are to be sampled via the buffer stage.

Example 11 may include the apparatus of Example 10, wherein the verification manager is to auto-zero the operational amplifier prior to determining whether the magnitude of the bounce voltage exceeds the threshold.

Example 12 may include the apparatus of any one of Examples 9 to 11, wherein the source bounce detector is to sample the source voltage from a selected node.

Example 13 may include the apparatus of Example 12, wherein a distance between the selected node and a driver coupled to the source line is greater than a distance between one or more other nodes and the driver.

Example 14 may include a method of verifying memory programming, comprising determining a magnitude of a bounce voltage on a source line associated with one or more memory cells, conducting a coarse-level program verification and a fine-level program verification of the one or more memory cells if the magnitude of the bounce voltage exceeds a threshold, and conducting the fine-level program verification of the one or more memory cells if the magnitude of the bounce voltage equals or falls below the threshold, wherein the coarse-level program verification is bypassed if the magnitude of the bounce voltage equals or falls below the threshold.

Example 15 may include the method of Example 14, wherein determining the magnitude of the bounce voltage includes sampling a return voltage on the source line, and sampling a source voltage on the source line.

Example 16 may include the method of Example 15, wherein the return voltage and the source voltage are sampled via a buffer stage coupled to an amplification stage.

Example 17 may include the method of Example 16, further including auto-zeroing an operational amplifier of the amplification stage prior to determining whether the magnitude of the bounce voltage exceeds the threshold.

Example 18 may include the method of any one of Examples 15 to 17, further including sampling the source voltage from a selected node.

Example 19 may include the method of Example 18, wherein a distance between the selected node and a driver coupled to the source line is greater than a distance between one or more other nodes and the driver.

Example 20 may include a memory controller apparatus comprising means for determining a bounce voltage on a source line associated with one or more memory cells, means for conducting a coarse-level program verification and a fine-level program verification of the one or more memory cells if the magnitude of the bounce voltage exceeds a threshold, and means for conducting the fine-level program verification of the one or more memory cells if the magnitude of the bounce voltage equals or falls below the threshold, wherein the coarse-level program verification is to be bypassed if the magnitude of the bounce voltage equals or falls below the threshold.

Example 21 may include the apparatus of Example 20, wherein the means for determining the magnitude of the bounce voltage includes means for sampling a return voltage on the source line, and means for sampling a source voltage on the source line.

Example 22 may include the apparatus of Example 21, wherein the return voltage and the source voltage are to be sampled via a buffer stage coupled to an amplification stage.

Example 23 may include the apparatus of Example 21, further including means for auto-zeroing an operational amplifier of the amplification stage prior to determining whether the magnitude of the bounce voltage exceeds the threshold.

Example 24 may include the apparatus of any one of Examples 21 to 23, further including means for sampling the source voltage from a selected node.

Example 25 may include the apparatus of Example 24, wherein a distance between the selected node and a driver coupled to the source line is greater than a distance between one or more other nodes and the driver.

Techniques described herein may therefore achieve programming time savings via an on demand knockout feature that uses dynamic source bounce detection to skip coarse sensing if the observed bounce is less than a predetermined threshold.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/ or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing system comprising:
   a system on chip (SoC);
   a bus coupled to the SoC, the bus including a source line; and
   a memory subsystem coupled to the bus, the memory subsystem including a plurality of memory cells associated with the source line and a controller apparatus comprising,
      a source bounce detector to determine a magnitude of a bounce voltage on the source line, and
      a verification manager to conduct a coarse-level program verification and a fine-level program verification of one or more of the plurality of memory cells if the magnitude of the bounce voltage exceeds a threshold, and conduct the fine-level program verification of the one or more memory cells if the magnitude of the bounce voltage equals or falls below the threshold, wherein the coarse-level program verification is to be bypassed if the magnitude of the bounce voltage equals or falls below the threshold, wherein a distance between a selected node and a driver coupled to the source line is greater than a distance between one or more other nodes and the driver.

2. The system of claim 1, wherein the source bounce detector is to sample a return voltage on the source line and sample a source voltage on the source line.

3. The system of claim 2, wherein the source bounce detector includes:
   a buffer stage; and
   an amplification stage coupled to the buffer stage, the amplification stage comprising an operational amplifier, wherein the return voltage and the source voltage are to be sampled via the buffer stage.

4. The system of claim 3, wherein the verification manager is to auto-zero the operational amplifier prior to determining whether the magnitude of the bounce voltage exceeds the threshold.

5. The system of claim 2, wherein the source bounce detector is to sample the source voltage from the selected node.

6. The system of claim 1, further comprising:
   at least one processor communicatively coupled to the memory subsystem; and
   a network interface communicatively coupled to the at least one processor.

7. An apparatus comprising:
   a source bounce detector to determine a magnitude of a bounce voltage on a source line associated with one or more memory cells; and
   a verification manager to conduct a coarse-level program verification and a fine-level program verification of the one or more memory cells if the magnitude of the bounce voltage exceeds a threshold, and conduct the fine-level program verification of the one or more memory cells if the magnitude of the bounce voltage equals or falls below the threshold, wherein the coarse-level program verification is to be bypassed if the magnitude of the bounce voltage equals or falls below the threshold, wherein a distance between a selected node and a driver coupled to the source line is greater than a distance between one or more other nodes and the driver.

8. The apparatus of claim 7, wherein the source bounce detector is to sample a return voltage on the source line and sample a source voltage on the source line.

9. The apparatus of claim 8, wherein the source bounce detector includes:
   a buffer stage; and
   an amplification stage coupled to the buffer stage, the amplification stage comprising an operational amplifier, wherein the return voltage and the source voltage are to be sampled via the buffer stage.

10. The apparatus of claim 9, wherein the verification manager is to auto-zero the operational amplifier prior to determining whether the magnitude of the bounce voltage exceeds the threshold.

11. The apparatus of claim 8, wherein the source bounce detector is to sample the source voltage from the selected node.

12. A method comprising:
    determining a magnitude of a bounce voltage on a source line associated with one or more memory cells;
    conducting a coarse-level program verification and a fine-level program verification of the one or more memory cells if the magnitude of the bounce voltage exceeds a threshold; and
    conducting the fine-level program verification of the one or more memory cells if the magnitude of the bounce voltage equals or falls below the threshold, wherein the coarse-level program verification is bypassed if the magnitude of the bounce voltage equals or falls below the threshold, wherein a distance between a selected node and a driver coupled to the source line is greater than a distance between one or more other nodes and the driver.

13. The method of claim 12, wherein determining the magnitude of the bounce voltage includes:
    sampling a return voltage on the source line; and
    sampling a source voltage on the source line.

14. The method of claim 13, wherein the return voltage and the source voltage are sampled via a buffer stage coupled to an amplification stage.

15. The method of claim 14, further including auto-zeroing an operational amplifier of the amplification stage prior to determining whether the magnitude of the bounce voltage exceeds the threshold.

16. The method of claim 13, further including sampling the source voltage from the selected node.

17. An apparatus comprising:
    means for determining a bounce voltage on a source line associated with one or more memory cells;
    means for conducting a coarse-level program verification and a fine-level program verification of the one or more memory cells if the magnitude of the bounce voltage exceeds a threshold; and
    means for conducting the fine-level program verification of the one or more memory cells if the magnitude of the bounce voltage equals or falls below the threshold, wherein the coarse-level program verification is to be bypassed if the magnitude of the bounce voltage equals or falls below the threshold, wherein a distance between a selected node and a driver coupled to the source line is greater than a distance between one or more other nodes and the driver.

18. The apparatus of claim 17, wherein the means for determining the magnitude of the bounce voltage includes:

means for sampling a return voltage on the source line; and means for sampling a source voltage on the source line.

19. The apparatus of claim 18, wherein the return voltage and the source voltage are to be sampled via a buffer stage coupled to an amplification stage.

20. The apparatus of claim 19, further including means for auto-zeroing an operational amplifier of the amplification stage prior to determining whether the magnitude of the bounce voltage exceeds the threshold.

21. The apparatus of claim 18, further including means for sampling the source voltage from the selected node.

22. A computing system comprising:
a system on chip (SoC);
a bus coupled to the SoC, the bus including a source line; and
a memory subsystem coupled to the bus, the memory subsystem including a plurality of memory cells associated with the source line and a controller apparatus comprising,
  a source bounce detector to determine a magnitude of a bounce voltage on the source line, wherein the source bounce detector includes an amplification stage comprising an operational amplifier, and
  a verification manager to conduct a coarse-level program verification and a fine-level program verification of one or more of the plurality of memory cells if the magnitude of the bounce voltage exceeds a threshold, and conduct the fine-level program verification of the one or more memory cells if the magnitude of the bounce voltage equals or falls below the threshold, wherein the coarse-level program verification is to be bypassed if the magnitude of the bounce voltage equals or falls below the threshold, wherein the verification manager is to auto-zero the operational amplifier prior to determining whether the magnitude of the bounce voltage exceeds the threshold.

23. The system of claim 22, wherein a distance between a selected node and a driver coupled to the source line is greater than a distance between one or more other nodes and the driver, wherein the source bounce detector is to sample the source voltage from the selected node.

24. An apparatus comprising:
a source bounce detector to determine a magnitude of a bounce voltage on a source line associated with one or more memory cells, wherein the source bounce detector includes an amplification stage comprising an operational amplifier; and
a verification manager to conduct a coarse-level program verification and a fine-level program verification of the one or more memory cells if the magnitude of the bounce voltage exceeds a threshold, and conduct the fine-level program verification of the one or more memory cells if the magnitude of the bounce voltage equals or falls below the threshold, wherein the coarse-level program verification is to be bypassed if the magnitude of the bounce voltage equals or falls below the threshold, wherein the verification manager is to auto-zero the operational amplifier prior to determining whether the magnitude of the bounce voltage exceeds the threshold.

25. The apparatus of claim 24, wherein a distance between a selected node and a driver coupled to the source line is greater than a distance between one or more other nodes and the driver, wherein the source bounce detector is to sample the source voltage from the selected node.

26. A method comprising:
determining a magnitude of a bounce voltage on a source line associated with one or more memory cells;
conducting a coarse-level program verification and a fine-level program verification of the one or more memory cells if the magnitude of the bounce voltage exceeds a threshold;
conducting the fine-level program verification of the one or more memory cells if the magnitude of the bounce voltage equals or falls below the threshold, wherein the coarse-level program verification is bypassed if the magnitude of the bounce voltage equals or falls below the threshold; and
auto-zeroing an operational amplifier of an amplification stage prior to determining whether the magnitude of the bounce voltage exceeds the threshold.

27. The method of claim 26, further including sampling the source voltage from a selected node, wherein a distance between the selected node and a driver coupled to the source line is greater than a distance between one or more other nodes and the driver.

28. An apparatus comprising:
means for determining a bounce voltage on a source line associated with one or more memory cells, wherein the means for determining a bounce voltage includes an amplification stage comprising an operational amplifier;
means for conducting a coarse-level program verification and a fine-level program verification of the one or more memory cells if the magnitude of the bounce voltage exceeds a threshold;
means for conducting the fine-level program verification of the one or more memory cells if the magnitude of the bounce voltage equals or falls below the threshold, wherein the coarse-level program verification is to be bypassed if the magnitude of the bounce voltage equals or falls below the threshold; and
means for auto-zeroing the operational amplifier of the amplification stage prior to determining whether the magnitude of the bounce voltage exceeds the threshold.

29. The apparatus of claim 28, further including means for sampling the source voltage from a selected node, wherein a distance between the selected node and a driver coupled to the source line is greater than a distance between one or more other nodes and the driver.

* * * * *